United States Patent [19]
Coe

[11] 4,034,310
[45] July 5, 1977

[54] PHASE-LOCKED LOOP OSCILLATOR

[76] Inventor: Thomas F. Coe, 3173-39 Bancroft Drive, Spring Valley, Calif. 92077

[22] Filed: Jan. 5, 1977

[21] Appl. No.: 757,112

[52] U.S. Cl. .................................. 331/11; 331/1 A; 331/10; 331/16
[51] Int. Cl.² .......................................... H03B 3/04
[58] Field of Search ................ 331/16, 10, 11, 2, 1, 331/18, 34; 328/155; 325/421

[56] References Cited
UNITED STATES PATENTS

| | | | |
|---|---|---|---|
| 3,063,021 | 11/1962 | Farrow | 331/10 |
| 3,909,735 | 9/1975 | Anderson et al. | 331/10 |

Primary Examiner—John Kominski
Attorney, Agent, or Firm—Isbell & Charmasson

[57] ABSTRACT

In a typical phase-locked loop oscillator circuit including a voltage controlled oscillator and a reference frequency source, from each of which a signal is derived and the phases of these two signals are compared in a phase detector, the output of which is applied through a loop filter to a frequency modulation input of the voltage controlled oscillator, so that the frequency of the voltage controlled oscillator is precisely controlled by the reference frequency; an improvement which comprises a maximum phase error detector which determines a maximum permitted phase error between the two inputs to the phase detector, and a phase error corrector circuit which, in response to the presence of a maximum permitted phase error, will shift the phase of one of the two signals applied to the phase detector relative to the source of that signal, such as to hold the phase error into the phase detector within the permitted maximum. This causes the voltage controlled oscillator to shift its frequency to the lock-up frequency in a smooth and steady manner. The improvement prevents operation of the system from being disrupted when the circuit falls out of lock, such as when the modulating signal has large low frequency components. The circuit also includes an out-of-lock detector which responds essentially instantaneously to an in-lock and out-of-lock condition and a means for altering the characteristics of the loop filter in order to minimize the effect of the out-of-lock condition upon the voltage controlled oscillator.

6 Claims, 3 Drawing Figures

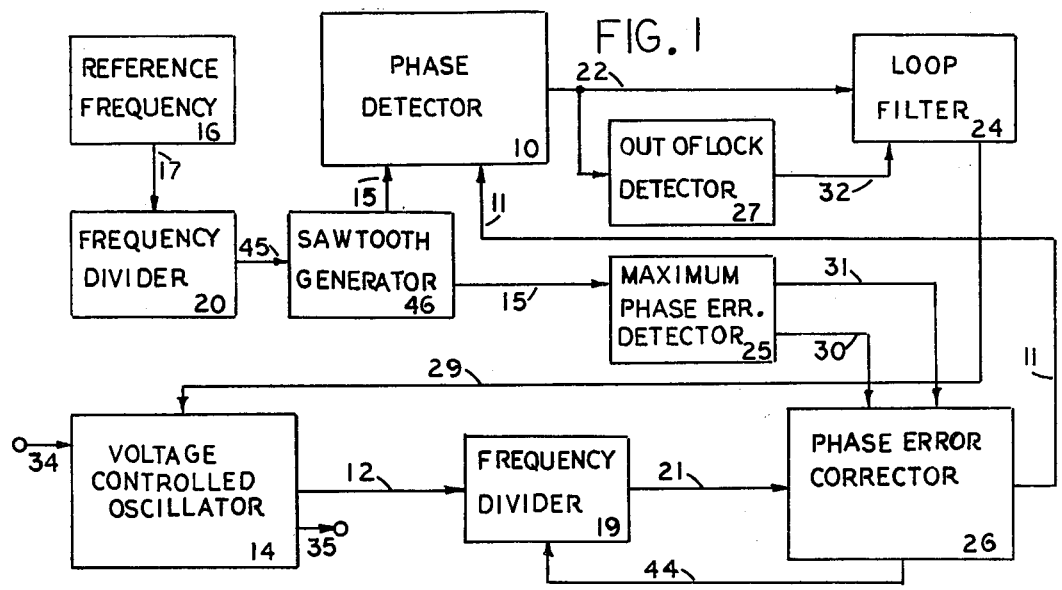
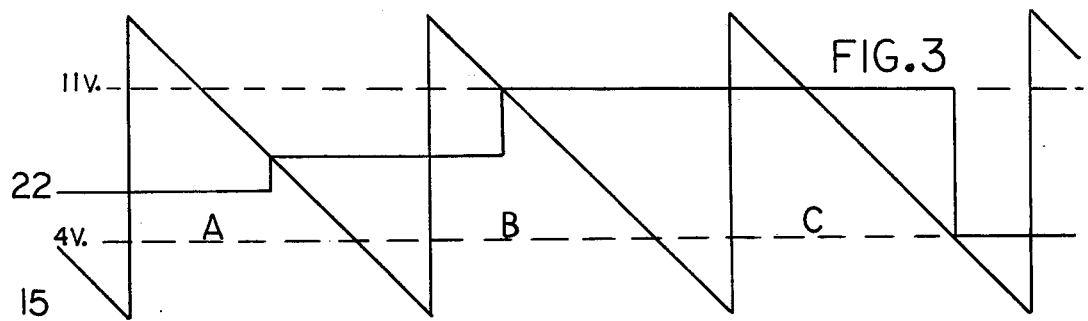
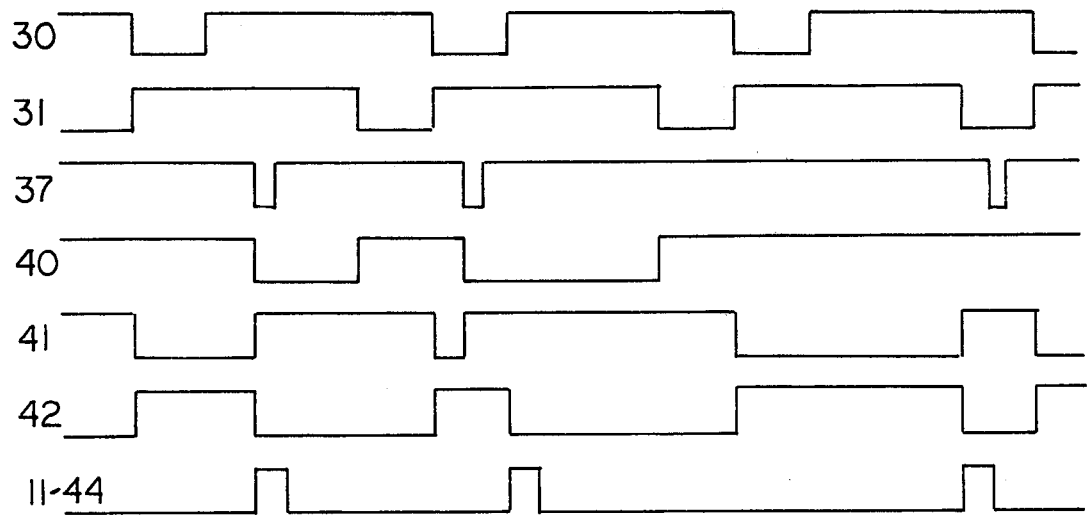

PHASE-LOCKED LOOP OSCILLATOR

BACKGROUND OF THE INVENTION

The present invention is directed to an improvement in the characteristics of a phase-locked loop oscillator circuit.

A typical phase-locked loop oscillator circuit includes a voltage controlled oscillator, a phase detector, and a loop filter. The voltage controlled oscillator provides an output signal having a frequency that is precisely controlled by referencing its phase to that of a reference frequency. The phase detector detects the phase error between a signal derived from the voltage controlled oscillator frequency and a signal derived from the reference frequency. The output of the phase detector is applied to the input of the loop filter, whose characteristics determine the characteristics of the phase-locked loop. The output of the loop filter is applied to a frequency modulation input of the voltage controlled oscillator. This closes a feedback loop which causes the voltage controlled oscillator frequency to track the reference frequency. When the phase of the signal derived from the voltage controlled oscillator frequency is tracking the phase of the signal derived from the reference frequency, it is said that the loop is in lock.

Before the loop comes into lock, the two signals applied to the phase detector are not the same frequency. Since the phase difference between them is constantly changing. The phase difference repeats itself once for every 360° of phase change, hence the output of the phase detector becomes an a-c waveform which oscillates once for every 360° of phase change. Some phase detector types in use will produce a d-c component of the proper polarity at its output when the loop is out of lock, but the output still has a-c components in addition. Any a-c components at the output which are not completely suppressed by the loop filter will frequency modulate the voltage controlled oscillator. In many applications this extraneous modulation is undesirable and hence an out of lock condition is detrimental to the operation of the system of which the phase-locked loop is a part. The design of the loop filter is usually a compromise from among many different desirable characteristics of a phase-locked loop. A loop filter design which will suppress all a-c voltages from the phase detector output is often to slow in responding to frequency variations between the two signals. Also a loop filter which provides fast lock-up characteristics, without the present invention, often cannot suppress all a-c voltages from the output of the phase detector.

When the voltage controlled oscillator arrives at the correct lock-up frequency, the frequency of the two signals applied to the phase detector will become identical. However, the phase error between them at that moment could be any value. Hence the phase-locked loop will momentarily shift the frequency of the voltage controlled oscillator to bring the phase error to zero, thereby producing additional extraneous modulation when lock-up is reached.

SUMMARY OF THE INVENTION

In accordance with the present invention the phase-locked loop is brought into lock by shifting the frequency of the voltage controlled oscillator in a smooth and steady manner to the lock-up frequency of the loop.

The present invention is characterised by the addition of a maximum phase error detector, a phase error corrector acting upon one of the two signals applied to the phase detector, an out-of-lock detector which senses when the phase error approaches the maximum permitted phase error and a means of altering the loop filter characteristics in response to the output from the out-of-lock detector.

In the preferred embodiment, whenever the phase error between the two inputs to the phase detector reaches the maximum permitted phase error, the phase of one of the two signals applied to the phase detector is continuously shifted, relative to the source of that signal, such that the resulting phase error applied to the phase detector never exceeds the permitted maximum. Thus the phase error into the phase detector, in this condition, remains constant. As a result, the voltage controlled oscillator will smoothly shift its frequency toward the correct lock-up frequency. When the frequency reaches the lock-up frequency, no more phase shifting will be required to hold the phase error within the permitted maximum. The loop then functions as a typical phase-locked loop that is in lock.

With the present invention, for many applications of a phase-locked loop, it is possible for the loop to go out of lock during normal operation without disrupting the operation of the system of which the loop is a part. This feature can be used to advantage when the voltage controlled oscillator is being frequency modulated by a signal that has a large low frequency components which can cause the loop to go out of lock, such as video signals with step changes in average picture level.

The present invention includes an out-of-lock detector that detects an out-of-lock condition by sensing when the phase error applied to the phase detector is near or at the maximum permitted phase error. This method of detection provides an instantaneous response to changes from an in-lock, to an out-of-lock, condition of the loop, or vice versa.

In many applications, the present invention will include a means for altering the characteristics of the loop filter in response to the output of the out-of-lock detector. This means of altering the loop filter characteristics can be further controlled by inputs from sources external to the phase-locked loop itself. One application would be to alter the loop filter in a manner to shorten the lock-up time when the loop is out of lock, then return to normal when the loop is in lock.

BRIEF DESCRIPTION OF THE DRAWING

FIG. 1 is a general block diagram of a preferred embodiment of the present invention, in conjunction with a phase-locked loop oscillator circuit.

FIG. 3 illustrates waveforms present in the circuit of FIG. 2.

DESCRIPTION OF THE PREFERRED EMBODIMENT

Figure 2:
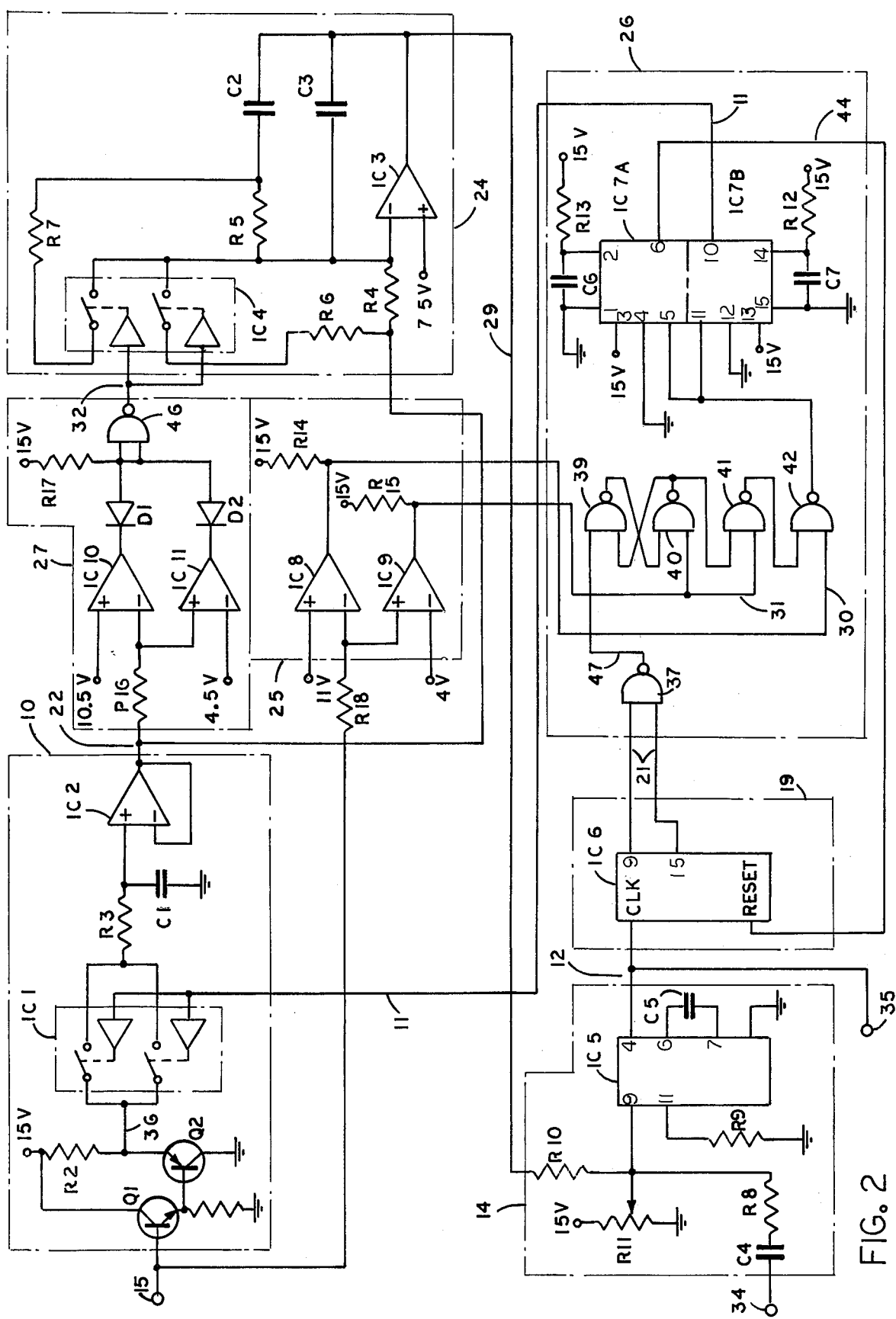
FIG. 2 is a schematic diagram of a functioning circuit which corresponds to the block diagram of FIG. 1.

Referring to the block diagram of FIG. 1, the parts which comprise a typical phase-locked loop of prior art are the reference frequency 16, phase detector 10, loop filter 24, and voltage controlled oscillator 14. Frequency divider 19 and frequency divider 20 are often incorporated into a typical phase-locked loop, but they are not always used.

Voltage controlled oscillator 14 has its frequency of oscillation controlled precisely by the phase locked loop. The voltage controlled oscillator can be frequency modulated by an external voltage signal applied at input 34. Input 29 is the frequency modulation input used by the phase-locked loop to control the oscillator frequency. The output of the voltage controlled oscillator 14 appears at output 35.

It is very often desired to perform phase detection at a frequency much lower than the voltage controlled oscillator frequency, in which case the output frequency on line 12 is divided by frequency divider 19 to produce the resulting derived signal on line 21.

Generally the present invention provides a technique for improving the operation of a standard phase-locked loop circuit as illustrated in FIG. 1.

The improved operation is achieved by adding a circuit for detecting when the phase shift between the reference frequency signal 17 and the signal derived from the voltage controlled oscillator 14 exceeds predetermined limits. In response to the detection of such excessive phase shift a correction circuit acts upon one of the signals and shifts its phase by an amount sufficient to return the phase error within the predetermined limits before applying said signal to the phase detector 10. This last step is best accomplished by a phase error corrector 26 which, first, limits the input signal 11 to the phase detector 10 so that its output signal 22 shall never reflect a phase-shift condition in excess of the predetermined limits, and, second, impress a permanent corrective phase shift upon said input signal 11.

The operation of the phase-locked loop circuit is further improved by the installation of a out-of-lock detector 27 and loop filter 24 having variable characteristics which can be selectively controlled by the output signal 32 of the out-of-lock detector 27. When the out-of-lock detector 27 senses a predetermined large phase shift error an alternate filter characteristic is selected.

In the preferred embodiment of the invention, the signal applied to the other input to the phase detector 10 on line 15 is derived from a reference frequency 16. In this block diagram, the reference frequency on line 17 is divided by frequency divider 20 to produce the divided frequency signal on line 45. This signal 45 is applied to a sawtooth generator 46 which generates a decaying sawtooth waveform on line 15, for every cycle of the divided frequency on line 45.

The voltage at the output of the phase detector 10 on line 22 is a function of the phase difference between the signal on line 15 and the signal on line 11. This voltage is run through the loop filter 24, and the resultant voltage on line 29 is applied to a frequency modulation input on the voltage controlled oscillator 14. This completes the feedback path of what is called a phase-locked loop.

The maximum phase error detector 25 can operate 1) by sensing the two inputs to the phase detector on lines 11 and 15 and providing an output on line 30 when the phase of the signal on line 11 leads that on line 15 by the maximum permitted phase error and an output on line 31 when the phase of the signal on line 11 lags behind that on line 15 by the maximum permitted phase error, or 2) it can sense the output on line 22 from the phase detector 10 to determine when a maximum phase error exists as determined by the voltage output level, or 3) as illustrated in FIG. 1, it can sense the instantaneous phase status during each cycle of the reference signal on line 15 applied to the phase detector and place an output on line 30 during the times when a timing signal on line 11 would be leading the phase of the signal on line 15 by greater than the maximum permitted phase error, and an output on line 31 during the times when the timing signal on line 11 would be lagging behind the phase of the signal on line 15 by greater than the maximum permitted phase error.

The out-of-lock detector 27 provides an output on line 32 whenever the phase error applied to the phase detector on lines 11 and 15 is near or at the maximum phase error. This can be determined by 1) sensing the phases of the signals on lines 11 and 15, 2) as shown in FIG. 1, by sensing the output of the phase detector on line 22, or 3) depending upon the type of maximum phase error detector 25 and phase corrector 26 which are used, it can sense for presence of an output on lines 30 or 31.

The output on line 32 is applied to an input on the loop filter 24 to control the altering of the characteristics of the loop filter.

A specific circuit which incorporates the present invention is shown in FIG. 2. A special feature of this circuit is that it cannot lock up on any incorrect frequency, including any harmonics or sub-harmonics of the correct lock-up frequency. The circuit will always pull the voltage controlled oscillator towards the correct frequency.

The circuit operates from a plus 15 volt d-c supply.

The reference frequency signal which is supplied to the phase detector 10 on line 15 is illustrated in FIG. 3. It is a one kilohertz sawtooth wave. Also illustrated in FIG. 3 are the voltage levels that are sensed by voltage comparators IC8 and IC9 and the general waveform on lines 30, 31, and 11, and at the output of gates 37, 40, 41 and 42.

The phase detector 10 is of the sample-and-hold type which senses the time relationship between a pulse on line 11 derived from the voltage controlled oscillator 14, and the sawtooth signal on line 15, derived from the reference frequency 16.

The frequency divider 20 and sawtooth generator 46 are not shown in FIG. 2. Various methods for the implementation of these two circuits are well known and are not particularly relevant to the invention.

The sawtooth signal on line 15 is applied to transistors Q1 and Q2. Transistors Q1 and Q2 are emitter followers which cause the voltage on line 36 to be identical to the voltage on line 15, but isolates line 15 from loads caused by IC1. IC1 is a known solid state switch which closes when a plus 15 volt sample pulse is present on line 11. IC1 is part of a Motorola MC14016. Capacitor C1 is charged to the voltage which is present on line 36 whenever the switch IC1 is closed. When the switch IC1 is open capacitor C1 holds that voltage until the next sample pulse occurs. Resistor R3 limits the charging current to a safe value. Operational amplifier IC2 is connected as a voltage follower, so that capacitor C1 cannot discharge when the switch IC1 is open and causes the voltage on line 22 to duplicate the voltage on capacitor C1.

When the frequency of the sample pulse on line 11 is identical to the frequency of the reference signal on lines 15 and 36, the sampling will always occur at the same point on the reference frequency waveform, and the output on line 22 will be a d-c voltage equal to the voltage of the reference signal at the time of sampling.

A zero phase error is considered to exist when sampling occurs at the time when the reference level 15 is midway between its extreme values of 3.0 and 12.0 volts, or at 7.5 volts.

The sawtooth span of 9 volt correspond to a 360° phase shift. A maximum tolerable phase shift limit of 140° will correspond to a 3.5 volt deviation on the sawtooth from the zero phase error level of 7.5V. Accordingly the maximum lead limit must be set when the pulse on line 11 occurs while to sawtooth level is above 11 volt. A maximum lag limit must be set when the pulse on line 11 occurs while the sawtooth level has fallen below 4 volts.

These limits are set by voltages comparators IC8 and IC9 which form the maximum phase error detector 25 as follows:

The sawtooth signal 15 is applied through limiting resistor R18 to the inverting input of voltage comparator IC8 and to the non-inverting input of voltage comparator IC9. The non-inverting input of IC8 is clamped to 11 volts while the inverting input of IC9 is clamped to 4 volts. During the time the signal on line 15 is above 11 volt the signal on line 30 is low. When the sawtooth level 15 drops below 11 volt line 30 goes to high. While the sawtooth level 15 remains above 4 volts the signal on line 31 is high and drops to zero as soon as the sawtooth 15 falls below 4 volts.

The phase error corrector 26 consists of NAND gates 37, 39, 40, 41 and 42 and monostable multivibrators IC7A and IC7B which is implemented with a MOTOROLA MC14528.

Gate 37 generates a narrow pulse each time the counter reaches count 1025.

When the narrow pulse out of gate 37 occurs while the level of the sawtooth 15 is between the maximum lead and lag limits as shown in cycle A of FIG. 3, the multivibrators IC7 is immediately triggered by ways of gates 39, 40, 41 and 42 as illustrated in the corresponding waveforms. A resulting phase indicator pulse on lines 11 closes the sample-and-hold in the phase detector 10.

When the narrow pulse occurs while the level of sawtooth 15 is above the maximum lead limit as shown in cycle B of FIG. 3, the pulse is intercepted and the multivibrator IC7B is triggered only when line 30 goes to high as illustrated in the corresponding waveforms. This causes a delay in the issue of the phase indicator pulse on line 11 by an amount sufficient to reduce its excessive lead below the maximum lead limit.

When the sawtooth reaches the maximum lag limit and a narrow pulse has not been received by the phase error corrector as shown in cycle C of FIG. 3, the multivibrator IC7B is triggered as illustrated by the corresponding waveforms. If the narrow pulse later occurs it is intercepted by gate 40 and nothing further happens. This causes the phase indicator pulse on line 11 to be advanced i.e. anticipated by an amount of time sufficient to reduce its excessive lag below the maximum lag limit. As a result the phase detector 10 is limited to sampling the sawtooth level 15 only within the maximum lead and lag limits.

The second multivibrator IC7A is also triggered every time the phase indicator pulse 11 is generated. The output pulse on line 44 is used to reset the frequency divider thus causing a permanent phase shift in the occurence of the narrow pulse. This phase correction returns the circuit to a in-lock operation as explained below.

Frequency divider 19 consists of counter IC6 made from a Motorola MC14020. The input line 12 is applied to the clock input of IC6. The output line 21 consists of two signals which are both high when the counter reaches a predetermined count of 1025. When the loop is in lock, a reset pulse 44 is applied on the reset input of IC6 each time the count reaches 1025. This causes the reset pulses to occur once for every 1025 cycles of the input frequency on line 12, dividing the input frequency by 1025 when the loop is in lock. A sample pulse on line 11 occurs each time a reset pulse occurs on line 44. Hence the lock-up frequency is 1025 times the frequency of the one kilohertz reference signal on line 15, which is 1,025 kilohertz.

The phase error corrector 26 consists of NAND gates 39, 40, 41 and 42 and monostable multivibrators IC7A and IC7B made from a Motorola MC14528. The monostable multivibrators in IC7 provide a plus 15 volt output pulse when the voltage at their input pins 5 and 11 makes a transition from plus 15 volts to zero volts. Capacitor C6 and C7 and resistor R12 and 13 determine the duration of the pulses on line 11 and 44. When the 1025 count pulse on line 47 occurs during the time the reference signal on line 15 is between 11.0 and 4.0 volts, the pulses on lines 11 and 44 begin at the start of the 1025 count pulse on line 47, and the loop functions as a typical phase-locked loop.

The NAND gates 39, 40, 41 and 42 cause the reset and sample pulses on lines 11 and 44 to occur once, and only once, each time the reference signal on line 15 passes from the 11.0 to 4.0 voltage points on its waveform. When the 1025 count pulse on line 47 occurs before the 11.0 volt point occurs, the reset and sample pulses are delayed until the 11.0 volt point occurs. This causes the phase detector output on line 22 to be 11.0 volts which is a maximum phase error, and causes the counter IC6 to be reset to zero at that time, thereby shifting the phase of the signal on line 47 relative to the signal on line 12. When the 1025 count pulse on line 47 does not occur before the time the 4.0 volt point occurs, the reset and sample pulses occur when the 4.0 volt point occurs. This causes the phase detector output on line 22 to be 4.0 volts which is at maximum phase error, and causes the counter IC6 to be reset to zero at the time, thereby shifting the phase of the signal on line 47 relative to the signal on line 12. When the 1025 count pulse on line 47 begins occurring between the time of the 11.0 and 4.0 volt points, the reset and sample pulses occur at the time of the 1025 count. This causes the loop to operate as a typical phase locked loop which is in lock, and in this circuit the phase of the signal on line 47 relative to the phase of the signal on line 12 remains at the phase relationship which existed when a maximum phase error last existed. Further improvement in the operation of the phase-locked loop circuit is obtained by use of the out-of-lock detector 27 and loop filter 24 described below.

The out-of-lock detector 27 senses the output of the phase detector on line 22. When the phase of the sample pulses on line 11 relative to the signal on line 15 cause an output on line 22 greater than 10.5 volts, the output of voltage comparator IC10 goes to zero volts. Similarly, when the output on line 22 is less than 4.5 volts, the output of voltage comparator IC11 goes to zero volts. These comparators operate in the same manner as those described previously. Normally R17 holds the voltage at the inputs of NAND gate 46 at plus 15 volts, causing the output on line 32 to be 0 volts.

The inputs to NAND gate 46 are pulled to 0 volts when the output of either IC10 or IC11 goes to 0 volts, which causes line 32 to go to plus 15 volts, indicating an out-of-lock condition.

The loop filter 24 is an integrator circuit formed by R4, R5, C2, C3, and operational amplifier IC3. In this circuit, the time constants of the integrator are shortened whenever the out-of-lock detector produces plus 15 volts on line 32. This is done by closing the solid state switches in IC4, placing R6 in parallel with R4, and R7 in parallel with R5. IC4 is part of a Motorola MC14016.

With the present invention, the capacitor C3 which has no series damping resistor can have a large capacity value that is comparable to the capacity value of the capacitor C2, which has the series damping resistor R5. This will provide good filtering of any a-c frequencies which could appear on line 22.

The output of the loop filter on line 29 is applied to a frequency modulation input of voltage controlled oscillator 14, where it goes through R10 to pin 9 of IC5. IC5 is the oscillator portion of a Motorola MC14046. The oscillator frequency range is set by R9, C5, and the adjustment of potentiometer R11. The external frequency modulation input 34 is a a-c coupled to pin 9 of IC5 via C4 and R8. The output of the voltage controlled oscillator on line 12 appears at output 35, and is also applied to the input of frequency divider 19.

While I have shown and described the preferred form of the present invention, changes and modifications may be made therein within the scope of the appended claims without departing from the spirit and scope of this invention.

What is claimed is:

1. In a phase-locked circuit where the frequency of a first signal is automatically and continuously adjusted in response to the output of a phase detector which measures the phase error between the first signal and a second reference signal, a device for improving the operation of the circuit which comprises:
    means for detecting when said phase error exceeds at least one predetermined limit; and
    means, responsive to said means for detecting, for shifting the phase of one of the signals in relation to its source by an amount sufficient to return said phase error within said limit before applying it to the phase detector.

2. The device claimed in 1 wherein said means for shifting comprise means for introducing a permanent phase correction to one of the signals in relation to its source before applying it to the phase detector.

3. The device claimed in 2 wherein said means for introducing comprises:
    means for limiting the input to the phase detector counter means for dividing the frequency of the signal whose phase has to be shifted; and
    means for resetting said counter means in response to said means for limiting.

4. The device claimed in 3 wherein said means for limiting comprises:
    means for sensing an excessive lead when the phase of the first signal leads the phase of the second signal by an amount in excess of a maximum lead limit;
    means for sensing an excessive lag when the phase of the first signal lags behind the phase of the second signal by an amount in excess of a maximum lag limit;
    means for delaying the phase of the first signal before applying it to the phase detector by an amount sufficient to reduce the excessive lead below the maximum lead limit; and
    means for advancing the phase of the first signal before applying to the phase detector by an amount sufficient to reduce the excessive lag below the maximum lag limit;

5. The device claimed in 3 wherein said means for resetting comprises:
    means for applying a reset signal to said counter means every time the phase of the first signal is delayed or advanced.

6. The device claimed in 4 wherein said means for sensing comprises:
    means for shaping the reference signal into one decaying waveform per cycle;
    means for generating a narrow pulse for each cycle of the output signal of said counter means;
    means for detecting when the amplitude of the sawtooth falls below a maximum limit;
    means for detecting when the amplitude of the sawtooth falls below a minimum limit;
    means for intercepting said narrow pulse when it occurs while the sawtooth is either above the maximum limit or below the minimum limit;
    means for generating a phase indicator signal at the time when the narrow pulse occur if the amplitude of the sawtooth is within the maximum and minimum limits;
    means for generating a phase indicator signal at the time when the sawtooth reaches the maximum limit after a narrow pulse has been intercepted;
    means for generating a phase indicator signal at the time when the sawtooth reaches the minimum limit if no narrow pulse has been generated during the current cycle of the reference signal; and
    means for applying said phase indicator signal to the phase detector.

* * * * *